Aug. 20, 1957 H. KIHN 2,803,804

VARIABLE INDUCTANCE TUNER FOR CONSTANT BANDWIDTH TUNING

Filed March 23, 1951 2 Sheets-Sheet 1

Inventor
Harry Kihn

By H. L. Newton

Attorney

VARIABLE INDUCTANCE TUNER FOR CONSTANT BANDWIDTH TUNING

Filed March 23, 1951 2 Sheets-Sheet 2

Inventor
Harry Kihn
By H. R. Newton
Attorney

United States Patent Office 2,803,804

Patented Aug. 20, 1957

2,803,804

VARIABLE INDUCTANCE TUNER FOR CONSTANT BANDWIDTH TUNING

Harry Kihn, Lawrenceville, N. J., assignor to Radio Corporation of America, a corporation of Delaware Application March 23, 1951, Serial No. 217,133

11 Claims. (Cl. 333—73)

This invention relates to high frequency tuners and particularly to high frequency tuners suitable for constant bandwidth circuits tunable over a wide high frequency tuning range.

In high frequency tuning applications such as encountered in television receivers, the frequencies are such that a small reactance has a high impedance and therefore a very small change in inductance will cause a very large change in frequency. Thus, it is difficult to provide a variable capacitor or variable inductor for tuning over a broad tuning range which provides a very slight change of reactance yet is readily and consistently tunable to a given tuning position for a selected frequency.

It is further desirable in many cases to maintain constant bandwidth response over the entire tuning frequency range. This is particularly desirable in television receivers, where the intelligence is contained within a passband of about six megacycles. If the passband of a television tuning circuit is kept constant at six megacycles, higher gain and better signal-to-noise ratio may be attained throughout the tuning range. As is well known in the art, in a parallel resonant tank circuit, the bandwidth is independent of the value of the inductance. This may be mathematically expressed by the relationship $BW=1/2\pi RC$, where R is the tuned circuit resistance and C is the tuned circuit capacity. Preferably, therefore, tuning is accomplished by changing only the inductance of the tuned circuit. Variable inductance tuning is therefore contemplated in accordance with the invention.

The primary problem involved in prior art high frequency tuners is in obtaining the necessary range of inductance variations, while maintaining the overall inductance very small. In accordance with the present invention, therefore, a high frequency variable inductance tuning means is provided with an inherently large variation in inductance without the addition of external lumped inductors.

It is therefore a general object of the invention to provide an improved ultra high frequency tuning device and system which is devoid of certain of the aforementioned and similar deficiencies of prior art tuning devices.

It is another object of the invention to provide a variable inductance tuner and system for maintaining a constant bandwidth over a predetermined wide frequency range.

It is a further object of the invention to provide a variable inductance tuner which has a very low inductance value but which may be readily and accurately varied within a relatively large inductance variation range.

A variable inductance tuner is therefore constructed, in accordance with the invention, of a thin disk of highly conductive material such as copper. An eccentric aperture is provided in the disk, over which is rotated a conductive spring contact plate contacting the disk along a portion of the edge of the eccentric aperture. The rotary plate may be semi-circular in form and may be arranged to rotate coaxially with respect to the aperture. The aperture thus creates a restricted conductive area in the disk for radio-frequency current flow. As the contact plate is rotated, the conductive area of the restricted portion is changed, thereby appreciably altering the inductance of the tuner.

According to one phase of the invention a ground plane comprising a highly conductive plate is mounted near the disk and parallel thereto to provide nearly uniform current distribution on the disk thereby greatly increasing the stability and tuning range at high frequencies.

Therefore it is a still further object of the invention to provide a variable inductance tuner having a variably adjustable restricted conductive section for high frequency current flow, whereby high stability and an increased tuning range at high frequencies is produced.

The novel features that are considered characteristic of this invention are set forth with particularity in the appended claims. The invention itself, however, both as to its organization and mode of operation, as well as additional objects and advantages will best be understood from the following description when considered in connection with the accompanying drawings, in which:

Figures 1 and 1*a* are top views of two similar embodiments of variable inductance tuning devices arranged for rotary tuning motion in accordance with the invention;

Figure 1:
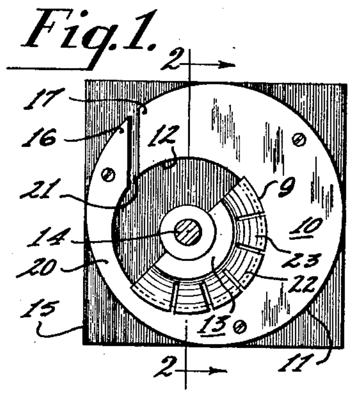
Figure 2:
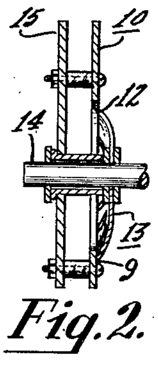
Figure 2 is an end view in section of the tuning device of Figure 1 as taken along the line 2—2.

Referring to the drawings, wherein like reference characters represent like components throughout the respective figures, and referring in particular to Figures 1 and 2, the invention is embodied in a compact variable tuning inductance, which may be used for constant bandwidth tuning in the 500 to 900 megacycle region, but which is applicable to considerably wider frequency ranges. The inductance which is varied consists of a thin curved strip conductor 10 having an unbroken flat planar surface of copper or other highly conductive material terminating at a gap or passageway 21. The strip conductor has a variable cross section along its length and, in the present embodiment, comprises a circular plate or disk having an outer perimeter 11 and having an inner eccentrically positioned circular aperture 12 which joins the passageway or gap 21. Thus the curved strip 10 provides a tuning device adapted for rotary tuning movement by sliding contact of a conductive spring contact plate 13 along the outer periphery 9 of the inner aperture 12. The plate 13 changes the strip inductance by effectively increasing the conductive area of the strip conductor variably upon rotation about its axis or shaft 14, which is common with the axis of the inner circle or aperture 12.

The curved strip conductor is placed near and parallel to a highly conducting plate or ground plane 15 so that the current distribution on the curved strip is uniform along its length. This provides means for extending the tuning range. Signal currents tend to flow along the inner periphery of the conductor strip 10. The inductance variation is thus reduced in absence of the ground plane 15 because the distributed capacity across the inner circular perimeter causes the current to flow near the periphery of the inner aperture 12, and the current flow will not be appreciably changed by rotation of the contact plate 13. However, when the current distribution is uniform, as when the ground plane conductor is used, rotation of the contact plate 13 appreciably changes the effective conductive cross section. Such being the case, rotation of the conductive contact plate 13 will materially alter the overall inductance presented between the terminals 16 and 17 and the device becomes tunable over a relatively large frequency range.

The basic principle of operation may be considered as the creation of the restricted cross section area 20, for radio frequency current flow, which is accomplished by eccentrically positioning the aperture 12 within the conductor strip 10. The single passageway or gap 21 leading exteriorly from the aperture provides for terminal connections 16 and 17, which are located on opposite sides thereof. The movable conductive means or plate 13 substantially forms a sector of a circle, slightly larger than that of the aperture 12, and is rotatable about the coaxial shaft 14 contacting the strip 10 around the periphery of the plate 13. By providing the spring legs such as 22 and 23 the washer firmly contacts the conductor strip 10 around the entire outer edge, thereby providing an additional conductive path of substantial cross section, which upon rotation moves along the strip 10 to substantially variably change the effective conductive cross section in circuit between the tuner terminals 16 and 17. Thus, in this embodiment, the inductance of the tuner is changed upon rotary movement of the washer 13 from one end of the strip 10 to the other.

It is to be recognized that the inherent inductance of a planar strip conductor 10 may be made very small. However, the cross section area of the restricted section 20 determines the overall inductance between the terminals 16 and 17 to such a large extent that a relatively large inductance range is provided when the contact plate 13 materially increases the effective conductive cross section near the restrictive portion 20.

It has been found that with a variable inductance constructed in this manner with the inner and outer diameters of the strip conductor being about one inch and two inches respectively, and with a shunted four micro-micro-farad capacitor, the resonant frequency is varied approximately from 360 megacycles to 290 megacycles. The tuning range is increased when desired by making the restrictive portion 20 smaller and by making the entire tuner larger so that there is a greater relative change of the major and minor conductive cross sections.

Figure 1A:
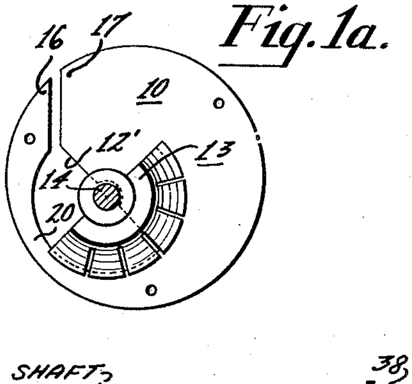

Although the conductive ground plane 15, parallel with and near the curved strip conductor 10, is desirable to increase the tuning range it is not necessary in all embodiments of the invention. This is shown in Figure 1*a*, and will be hereinafter explained in connection with other embodiments of Figures 7 and 8. In the embodiment of Figure 1*a*, a greater frequency range and a higher high frequency limit is obtained by shaping the inner eccentric aperture to correspond to that of the movable tuning means 13, whereby the aperture 12′ is substantially conductively closed in one position of rotation of the contact plate 13, providing a very small inductance. However, a smooth control is provided even at the very low inductance values because a relatively large change in angular rotation is necessary to provide a small departure from the original inductance setting.

As before explained, constant bandwidth tuning may be attained with a variable inductance tuner. The embodiment shown in Figure 1 is therefore very suitably adapted for such tuning. The embodiment shown in Figure 1*a* in absence of a ground plane conductor 15 may also be used since rotation of the plate 13 then has very little effect upon changing the capacity of the tuner by presenting a larger area in capacitive contact with the ground plane.

Figure 3:
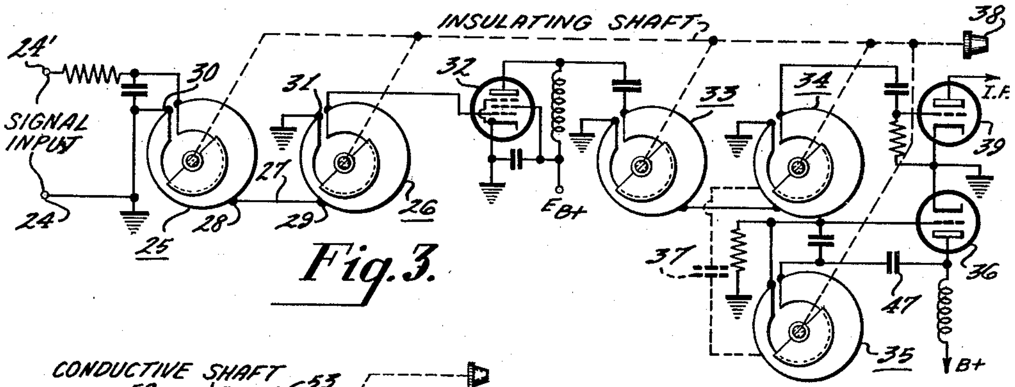
Figure 3 is a schematic circuit diagram of a variable frequency, constant bandwidth signal conveying system including variable inductance tuning devices of the type shown in Figures 1 and 2, in accordance with the invention.

A constant bandwidth high frequency tuning system comprising the input section of a superheterodyne receiver and utilizing the above described tuning inductors is shown in Figure 3. In order to maintain constant bandwidth with a plurality of tuners, the effective operating selectivity of the tuners and the coupling should be varied as the frequency is changed. Since the bandwidth percentage relationship with frequency decreases with increasing frequencies, the selectivity should increase and the coupling decrease. To obtain this variation in selectivity, in this system a pair of the high frequency tuners 25 and 26 are coupled by a conductor 27 which connects the terminal points 28 and 29, which are located at intermediate positions on the conductive strip surfaces. Therefore signal input terminals 24 and 24′, to which an antenna or other signal input source may be connected, is coupled by a signal transfer network to terminals 30 near the ends of the tuner surface of the first tuner 25, and signal output terminals 31 may be connected near the ends of the other tuner 26. By means of the conductive coupling connection 27 a coupling coefficient is attained which is inversely proportional to frequency, and critical coupling and operating selectivity may be maintained between the two tuners 25 and 26 throughout the variable tuning range. As a result the coupling coefficient varies in approximately the desired manner so that both the bandwidth and impedance matching may be maintained constant.

The output signal from the tuner 26 may be amplified by a tube 32 and coupled to a similar pair of constant bandwidth tuners 33 and 34. A further single section tuner 35 is used to vary the frequency of an oscillator circuit including the tube 36. Oscillator injection is provided by the stray capacity between the disks of tuners 34 and 35 indicated by the dotted capacitor 37. The tuners are connected together for unicontrol operation by means of a control knob 38, to provide by the well known superheterodyne principle, an intermediate frequency signal at the output circuit of the tube 39. Thus by using the tuners in the system, and by providing coupling means between intermediate positions on the conductive surfaces of two adjacent tuners, improved operation is provided for the constant bandwidth system. It is noted that the dual connected tuners provide a higher selectivity than possible with a single unit, and thus provide increased gain necessary for best operation of high frequency tuning circuits.

Figure 4:
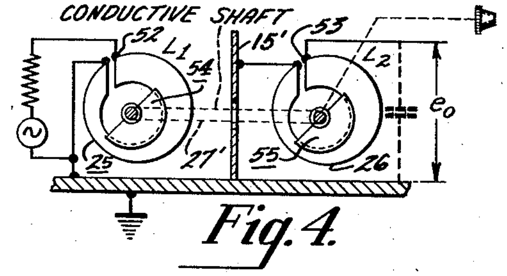
Figure 4 is a schematic circuit diagram, showing the diagrammatic relationship of certain tuner parts, partly in section, in a modification of the invention for obtaining constant bandwidth tuning in a signal conveying system.

As shown in Figure 4, another method of coupling is provided which increases the coefficient of coupling as the frequency decreases and thus effects constant bandwidth tuning. In this embodiment the tuning shaft 27′ is conductive and provides the conductive coupling between the tuners 25 and 26. The ground plane conductor 15′ is shown inserted between the two tuners 25, 26 to provide the function hereinbefore described.

Figure 5:
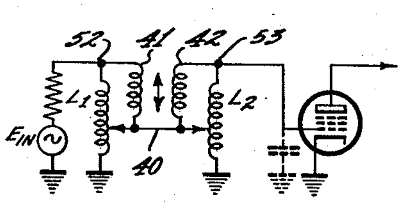
Figure 5 is an equivalent circuit diagram of the constant bandwidth tuning system of Figure 4.

An equivalent circuit of the tuner of Figure 4 is shown in Figure 5 to clearly illustrate how the component parts may be designed by one skilled in the art to accomplish the constant bandwidth tuning desirable in connection with the invention. Thus the lead 40 represents the conductive coupling shaft 27'. The inductances 41 and 42 represent the respective inductance between the shaft at the center of the conducting contact plates 54 and 55 and the high signal potential connection terminals 52 and 53 of each of the tuning inductive strips $L_1$ and $L_2$. As the contact plates 54 and 55 approach the high signal potential terminals 52 and 53 the shortest physical conductive path and therefore the inductance from the shaft 27' to the terminal decreases. The arrow between inductors 41 and 42 then signifies that they change in value upon movement of the mechanically coupled contact plates. It is readily seen therefore that as the sliding contact plate approaches the top of the respective inductors $L_1$ and $L_2$ the series coupling inductors 41 and 42 will represent a smaller impedance and the coupling will therefore increase. Thus, the proper tuning characteristics for constant bandwidth tuning are provided, and the values of each inductance may be chosen by those skilled in the art to suit any particular tuning circuit for which the device may be adapted.

Figure 6:
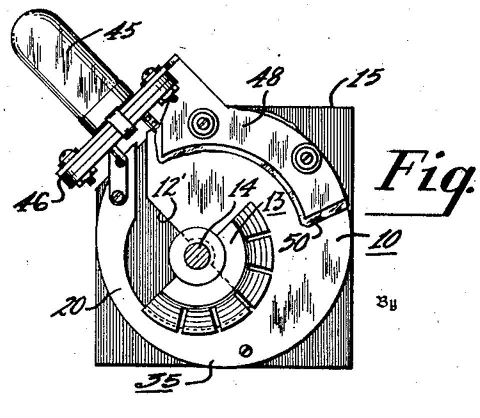
Figure 6 is an end view of ultra high frequency oscillator apparatus utilizing the variable inductance tuning device of the invention.

Figure 6 illustrates the compactness and adaptability of the tuning inductance for use in systems usable for the high frequency tuning ranges. Thus a miniature tube 45 and socket 46 may be mounted very closely to the ends of the conductive strip 10 so that lead inductance is kept at a minimum and the full tuning range of the variable inductance may be realized. If we consider the circuit as the Colpitts oscillator circuit of Figure 3, the capacitor 47 coupling the anode of tube 36 to the end of the strip conductor 10 of tuner 35 is provided by a broad conductive strip 48 having very low series inductance and providing a capacity with the strip 10 by means of mica, or other dielectric spacers 50.

Here the tuning embodiment of Figure 1*a* may be used in connection with a conductive ground plane 15 to provide an even more increased tuning range, since a constant bandwidth requirement is not necessary in the single tuned local oscillator of a superheterodyne receiver. In this manner a very high degree of stability and very low radiation characteristic is imparted to the oscillator. Accordingly, even at high frequencies precise calibration of the tuning system may be made.

Figure 7:
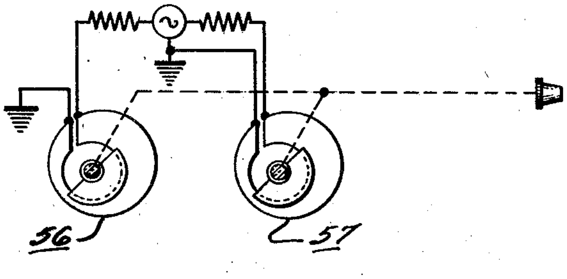
Figure 7 is a schematic circuit diagram of a high frequency signal tuning system constructed in accordance with the invention, for push-pull operation.

If two of the tuning inductors 56 and 57 are connected in push-pull in a tuning circuit, as shown in Figure 7, and placed close to each other, the current distribution will be correct to provide a large inductance range in a manner similar to that provided by the conductive ground plane 15. In addition, since these inductors are used at high frequencies, the close spacing of balanced circuits, or a ground plane as used within a single ended circuit, is useful in reducing radiation losses, thus effectively increasing the circuit gain.

Figure 8:
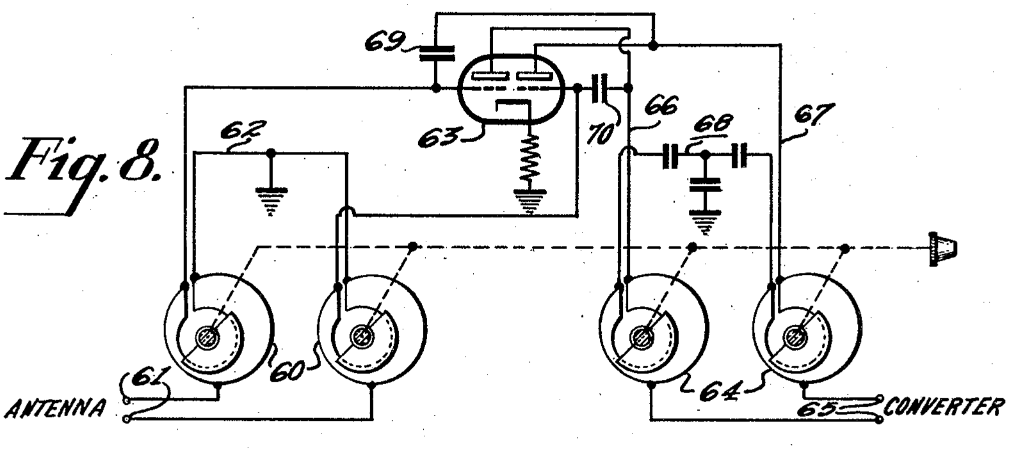
Figure 8 is a schematic circuit diagram of an ultra high frequency tuning system in accordance with the invention.

As shown in Figure 8, push-pull tuning may be used in connection with a neutralized single stage double-triode amplifier for improved operating results at high frequencies. It is well known in the art that higher frequency operation may be realized in push pull tuning circuits, since tube and wiring capacity is reduced and more stable tuning is possible. Thus the variable inductance tuner of this invention is well adapted to provide stable operation in this type circuit, in which the variable inductance alone determines the tuning over a very large tuning frequency spectrum. In this system, a first pair of tuning inductors 60 has a pair of signal input terminals 61, which may represent antenna input leads, and which are connected respectively to midpoint terminals on each of the conductive strips of inductors 60.

A conductive lead 62 commonly connects one of the end terminals of each conductive strip, and a push-pull twin triode amplifier tube 63 has its two grid input terminals connected respectively to the other end terminals of each of the conductive strips. Likewise a second pair of tuning inductors 64 is connected between output converter leads 65 and input leads 66 and 67 from respective anodes of the amplifier tube 63 in a similar manner. Two of the end terminals of the conductive strips of this stage are connected and a ground point is established by means of the capacitor network 68. Neutralizing capacitors 69 and 70 are connected between opposite grids and anodes of the twin triode amplifier tube 63 in a conventional manner. This circuit because of the improved tuning devices of this invention together with the reduced capacity of push pull operation provides tuning within a wide frequency spectrum and at a higher frequency than is generally possible with prior art variable inductors, yet maintains an accurately calibratable tuning characteristic under all conditions.

Figure 9:
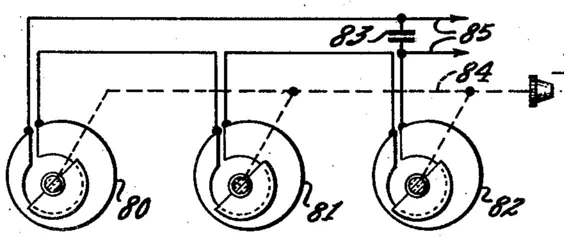
Figure 9 is a schematic circuit diagram showing a signal circuit tuning arrangement of series connected variable inductance tuning devices, in accordance with the invention.

In some cases it is desirable to have a larger amount of inductance than is possible with a single tuning inductor. Yet it would be desirable to retain the advantages of the present tuner in many cases, so they may be connected serially as shown in Figure 9 across any tunable signal circuit. Thus, the series inductance of tuners 80, 81 and 82 provide in combination with the capacitor 83 a tuned circuit 85 which is variably controlled by means of the ganged tuning control means 84 to tune over a lower frequency range than would be possible with a single inductor.

Figure 10:
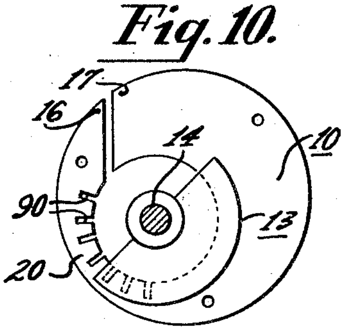
Figure 10 is a plan or end view of a variable tuning device in accordance with a further phase of the invention which is adapted to provide fine tuning within selected television signal channels or the like; and, Figure 11 is a diagrammatic illustration of impedance coupled tuning devices in accordance with the invention.

For fine tuning within separated television bands or the like, the tuner 10 may be modified as shown in Figure 10 to produce discrete frequency tuning steps. The strip inductor is provided with spaced notches 90 of suitable depth and width to increase the inductance materially between the notches and provide tuning stops or bands. It is thereby recognized that precise tuning within channels relatively widely separated in a high frequency tuning range may thus easily be accomplished with the presently described tuner. In the present example the restricted areas are provided by notching formed in the inner edge of the eccentric openings in the conductor disks, as indicated.

Figure 11:
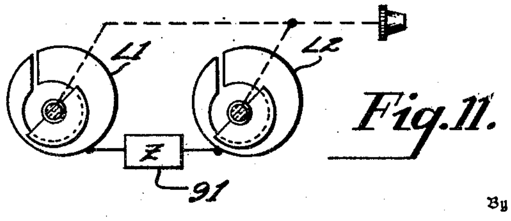

Figure 11 illustrates a pair of variable inductor tuners $L_1$ and $L_2$ coupled between intermediate points upon their respective conductive strips by an impedance element 91. Capacitive, inductive or resistive impedance may thus be provided as required for producing proper coupling between the tuners for the specific circuits to which the tuners may be adapted.

There has thus been described an improved tuning means for high frequency signal circuits having physical compactness and providing improved operational characteristics at low cost. The tuning means is further adapted to be combined in circuit in high frequency signal tuning systems having a series of coupled circuits for multiple unitary tuning operation as has been shown.

What is claimed is:

1. A tuner for high frequency signals variably tunable within a large frequency spectrum, comprising a conductive ground plane, a curved strip conductor having a flat planar surface mounted near said ground plane and parallel therewith, said strip conductor having a variable radial cross-section with respect to an axis of rotation perpendicular to said planes, signal connection means connected to said curved strip conductor substantially at opposite ends thereof, and a planar conductive tuning element rotatable about said axis of rotation, said conductive tuning element having a fixed area in contact with said conductor along a portion of the length thereof for effectively increasing the conductive radial cross-sectional dimension of said strip conductor at the position of contact, and said tuning element being movable along the length of said conductor upon rotation thereof to tune said tuner to a predetermined frequency within said large frequency spectrum.

2. A tuner for high frequency signals variably tunable within a large frequency spectrum, comprising a unitary curved strip conductor having a flat planar surface defining an aperture eccentrically surrounded by said conductor except for a passageway leading through the conductor exteriorly from said aperture in the plane of the conductor, terminal connections for an electronic signal, said connections being connected to said conductor on opposite sides of said passageway, and movable conductive means having a substantially planar surface contacting said conductor and rotatable about an axis of said aperture for conductively substantially closing different portions of said aperture to thereby change the inductance between said terminals.

3. A tuner as defined in claim 2 with notches provided in said strip conductor of such dimensions that precise tuning may be accomplished within channels relatively widely spaced in a high frequency tuning range.

4. A tuner as defined in claim 2 provided with a conductive ground plane parallel with and near to said curved strip conductor.

5. A tuner for high frequency signals variably tunable within a large frequency spectrum, comprising a unitary curved strip conductor having a flat planar surface defining an aperture shaped as a sector of a circle, said aperture eccentrically surrounded by said conductor except for a passageway leading exteriorly from said aperture in the plane of said conductor, terminal connections for an electronic signal, said connections being connected on opposite sides of said passageway, and movable conductive means firmly contacting said conductor and forming a further sector of a larger circle rotatable about the axis of the first mentioned circle for conductively substantially closing said aperture to thereby change the inductance between said terminals.

6. A tuner for high frequency signals variably tunable within a large frequency spectrum, comprising a unitary curved strip conductor having a flat planar surface defining a substantially circular aperture eccentrically surrounded by said conductor except for a passageway leading exteriorly from said aperture in the plane of said conductor, terminal connections for an electronic signal, said connections being connected on opposite sides of said passageway, conductive means movable to close different portions of said aperture, said aperture to thereby change the inductance between said terminals, said movable means being a half circular substantially planar conductor of diameter larger than the first mentioned circle, and a conductive ground plane being located substantially parallel to said conductor and closely spaced therewith.

7. A constant bandwidth tuner for high frequency signals comprising, a pair of curved strip conductors having flat planar surfaces defining apertures eccentrically surrounded by each conductor except for a passageway leading through each conductor exteriorly from each aperture in the plane of the respective conductors, a pair of terminal connectors for each conductor, said connectors being connected to said conductors on opposite sides of the respective passageways, a common conductive connection between one terminal of each conductor, a conductive circuit connection between positions on said conductors intermediate said terminals, and means to conjointly conductively vary the effective inductance of said conductors including a pair of individual movable conductive means contacting said conductors respectively and having substantially flat planar surfaces rotatable about an axis of said apertures to effect tuning whereby constant bandwidth is maintained because of a coefficient of coupling between said conductors which varies inversely with frequency.

8. A high frequency tuner comprising in combination, an elongated conductor having a flat planar surface with its width dimension varying from one end to the other, a pair of terminals at opposite ends of said conductor for connection to a signal source, and means providing a planar conductive tuning element having a substantially fixed area in contact with a portion of the length of said conductor and extending therefrom to increase the effective conductive width of said conductor at the position of contact, said planar conductive tuning element being movable along the length of said conductor to vary the effective conductive width of said conductor at a selected position along the length thereof to selectively adjust the inductance in circuit between said terminals.

9. A tuner as defined in claim 7 having a conductive ground plane located between said conductors and substantially parallel therewith.

10. In a high frequency tuning system, the combination of a plurality of variable inductance tuners connected for constant bandwidth operation, comprising a pair of curved strip conductors having flat planar surfaces defining apertures eccentrically surrounded by each conductor except for a passageway leading through each conductor exteriorly from the apertures in the plane of the respective conductors, a pair of terminal connectors for each conductor, said connectors being connected to said conductors on opposite sides of said passageways, a common conductive connection between one terminal of each conductor, a conductive circuit connection between positions on said conductors intermediate said terminals, and means conjointly movable to close different portions of said apertures to effect tuning whereby constant bandwidth is maintained with a coefficient of coupling between said conductors which varies inversely with frequency.

11. A constant bandwidth high frequency tuning system comprising in combination, a pair of high frequency tuners having flat planar surfaces with varying width from one end to the other and means movable along said surfaces to vary the inductance thereof, coupling means between intermediate positions on said surfaces, signal input terminals connected near the ends of the first of said tuner surfaces, signal output terminals connected near the ends of the other of said tuner surfaces, means for varying the inductance of said tuners concurrently comprising a commonly connected control shaft, said shaft being of conductive material and comprising said coupling means between said intermediate positions and the coupling means thereby being continuously variable to effect constant bandwidth over a large tuning frequency range.

References Cited in the file of this patent

UNITED STATES PATENTS

| | | |
|---|---|---|
| 2,092,069 | Hollmann | Sept. 7, 1937 |
| 2,175,710 | Usselman et al. | Oct. 10, 1939 |
| 2,367,576 | Harvey et al. | Jan. 16, 1945 |
| 2,428,272 | Evans | Sept. 30, 1947 |
| 2,442,615 | Percival | June 1, 1948 |
| 2,471,705 | Schmitt | May 31, 1949 |
| 2,508,138 | Bernstein | May 16, 1950 |
| 2,513,392 | Aust | July 4, 1950 |
| 2,513,393 | Frey et al. | July 4, 1950 |
| 2,513,761 | Tyson | July 4, 1950 |
| 2,543,560 | Thias | Feb. 27, 1951 |
| 2,561,398 | Miller | July 24, 1951 |
| 2,627,579 | Wasmansdorff | Feb. 3, 1953 |
| 2,629,081 | Hubbard | Feb. 17, 1953 |
| 2,693,581 | Osborn | Nov. 2, 1954 |
| 2,709,788 | Schmidt | May 31, 1955 |
| 2,715,211 | Murakami | Aug. 9, 1955 |